United States Patent [19]
Go et al.

[11] Patent Number: 6,008,528
[45] Date of Patent: Dec. 28, 1999

[54] SEMICONDUCTOR LEAD FRAME WITH CHANNEL BEAM TIE BAR

[75] Inventors: Chill Go; Alejandro N. Lacap; Noel C. Yasay, all of Baguio, Philippines

[73] Assignee: Texas Instruments Incorporated, Dallas, Tex.

[21] Appl. No.: 09/041,581

[22] Filed: Mar. 12, 1998

Related U.S. Application Data

[60] Provisional application No. 60/065,325, Nov. 13, 1997.

[51] Int. Cl.⁶ .................................................. H01L 23/495
[52] U.S. Cl. ............................................................ 257/670
[58] Field of Search .................................. 257/667, 669, 257/670, 674

[56] References Cited

U.S. PATENT DOCUMENTS

| | | | |
|---|---|---|---|
| 5,554,885 | 9/1996 | Yamasaki et al. | 257/669 |
| 5,637,913 | 6/1997 | Kajihara et al. | 257/674 |
| 5,661,338 | 8/1997 | Yoo et al. | 257/670 |
| 5,763,942 | 6/1998 | Suzuki | 257/670 |

*Primary Examiner*—Sheila V. Clark
*Attorney, Agent, or Firm*—Jacqueline J. Garner; Wade James Brady; Richard L. Donaldson

[57] ABSTRACT

The invention is a lead frame (30) with tie bars (32–35) having reenforcing channels (44, 53, 64) extending at least a portion of the length of the tie bar. The lead frame (30) and channels (44, 53, 64) in the tie bars (32–35) may be formed either by stamping or by chemical etching. Each channel tie bar has at least two parts (51,52) forming a channel, the parts extending from each other at an angle less than 180°.

7 Claims, 4 Drawing Sheets

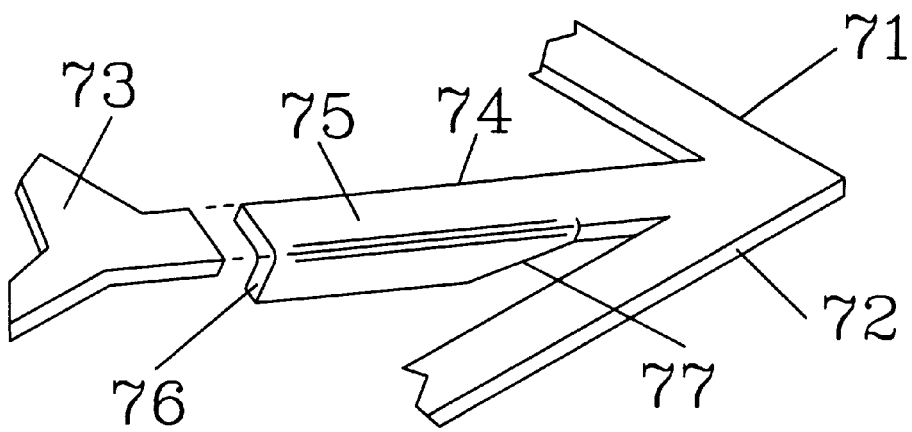
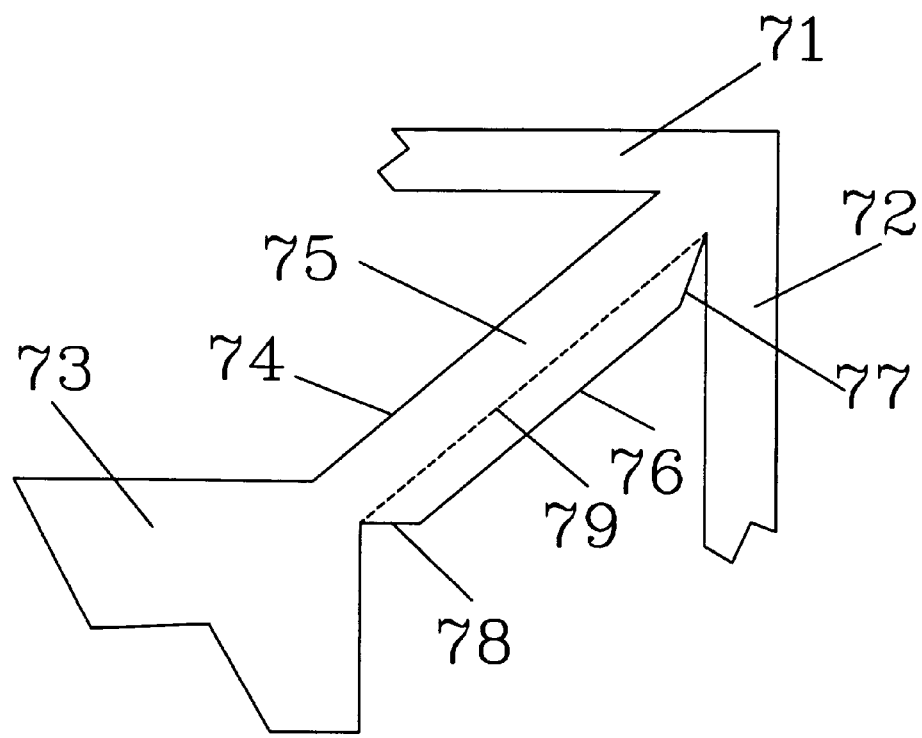

SEMICONDUCTOR LEAD FRAME WITH CHANNEL BEAM TIE BAR

This application claims priority under 35 USC § 119(e)(1) of provisional application No. 60/065,325 filed Nov. 13, 1997.

FIELD OF THE INVENTION

The invention relates to a semiconductor lead frames, and more particularly to an improved lead frame with improved die pad stability provided by the use of channel beam tie bars.

BACKGROUND OF THE INVENTION

Presently manufactured lead frames, particularly Quad Flat Package devices, have the die mount pad supported by flat tie bars. The tie bars are attached between the corners of the die mount pad and the lead frame which may form, in part, the dam bars that hold the leads spaced at desired intervals during the package molding process. An example of this prior art structure is shown in U.S. Pat. No. 5,285,104 in which the corners of the die mount pad are attached by tie bars to the lead frame.

Another example of tie bars extending from the die attach area is shown in U.S. Pat. No. 5,429,992. In this example, a die pad is not used. The tie bars are connected to an X-type or cross shaped structure which supports the semiconductor die.

Still other examples of lead frames utilize only two tie bars to support the semiconductor die mount pad. An example of this structure is shown in U.S. Pat. No. 5,096,852, wherein the die mount pad is supported by two diagonally opposite tie bars extending out opposites sides of the die mount pad. A similar structure is shown in U.S. Pat. No. 5,548,884.

U.S. Pat. No. 5,517,056 also shows the lead frame structure where the die mount pad is attached to the lead frame by tie bars extending from the corners of the die mount pad.

The prior art, as indicated above, utilizes two to four flat tie bars. The tie bars extend from the corners of the mount die pad when four die pads are used, and when two tie bars are used, the tie bars extend from two opposite sides of the die mount pad. These flat tie bar configurations do not provide adequate support to the die mount pad during molding. Often, during the molding process of the package, the die mount pad will shift upward or downward to the surface of the package. When this happens, the device is rejected. The movement is caused by the pressure of the mold compound on the surface of the die or die mount pad, and the flexing of the tie bars. This problem is common, particularly in thin packages. In order to prevent the flexing of the tie bars, the bars need to be strengthen.

SUMMARY OF THE INVENTION

The invention is a lead frame with tie bars having reenforcing channels extending at least a portion of the length of the tie bar. The lead fame and channels in the tie bars may be formed either by stamping or by chemical etching. Each channel tie bar has at least two parts forming a channel, the parts extending from each other at an angle less than 180°.

The technical advance represented by the invention, as well as the objects thereof, will become apparent from the following description of a preferred embodiment of the invention when considered in conjunction with the accompanying drawings, and the novel features set forth in the appended claims.

BRIEF DESCRIPTION OF THE DRAWINGS

FIG. 7 is an isometric view of a part of a lead frame showing the channel structure of a stamped channel tie bar with a portion bent downward from the top surface of the tie bar; and FIG. 8 is a top view of the partial lead frame of FIG. 7.

DESCRIPTION OF A PREFERRED EMBODIMENT

Figure 1:
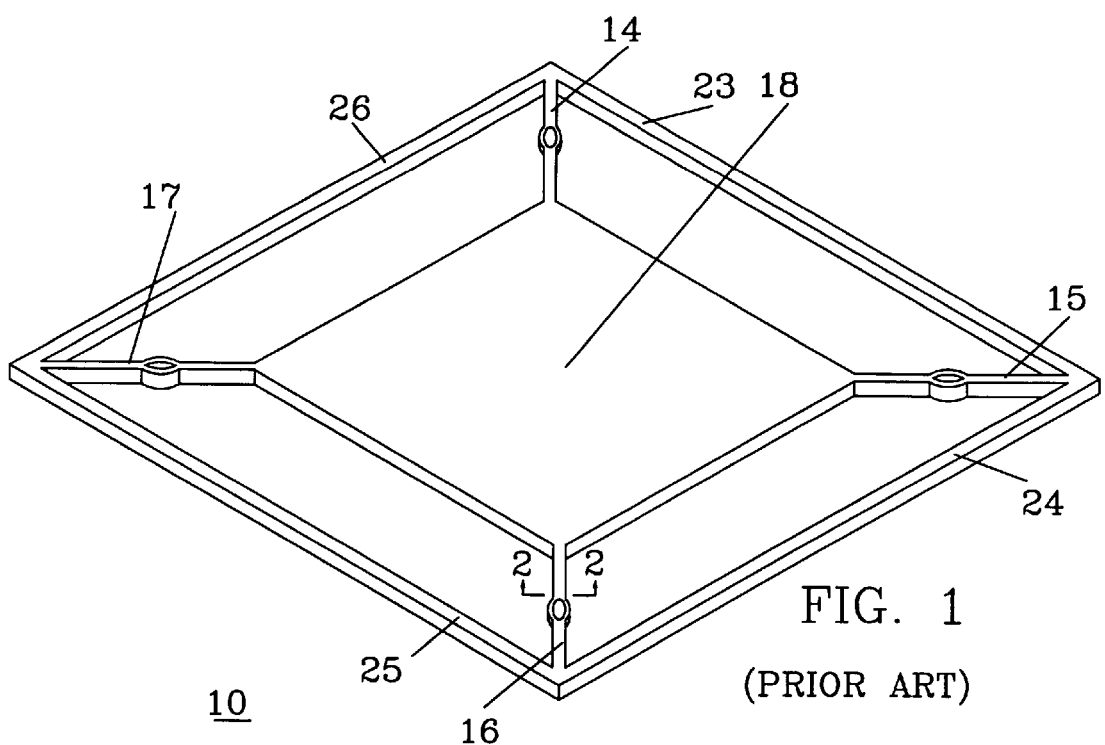
FIG. 1 shows a prior art lead frame.

FIG. 1 shows a prior art lead frame 10. Lead frame 10 includes a die mount pad 18 secured to the lead frame rails 23, 24, 25 and 26. Lead frame leads have been omitted in this FIG. 1. Rails 23–26 also may serve as dam bars which temporally support lead frame leads. In this prior art lead frame, tie bars 14, 15, 16 and 17 secure die mount pad 18 to the lead frame rails 23–26 during the manufacturing process when a semiconductor die (not illustrated) is mounted on and secured to die mount pad 18, and leads are attached to the semiconductor die.

Figure 2:
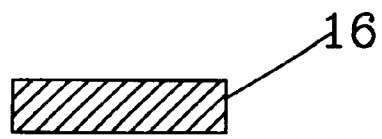
FIG. 2 is a cross-sectional view of the channel beam tie bar of FIG. 1.

FIG. 2 is a prior art tie bar 16 of FIG. 1 taken through section 2—2. Tie bar 16 is a flat bar and is usually of the same thickness as lead frame rails 23–26 and die pad 18. Tie bar 16 (also tie bars 14, 15 and 17) having a flat cross-section is subject to being bent or flexed between its two end points where it is attached to die pad 18 and the lead frame rails.

Figure 4:
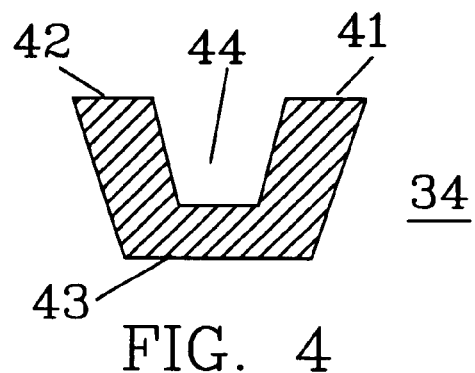
FIG. 4 is a cross-sectional view of the channel beam tie bar of FIG. 3.
Figure 3:
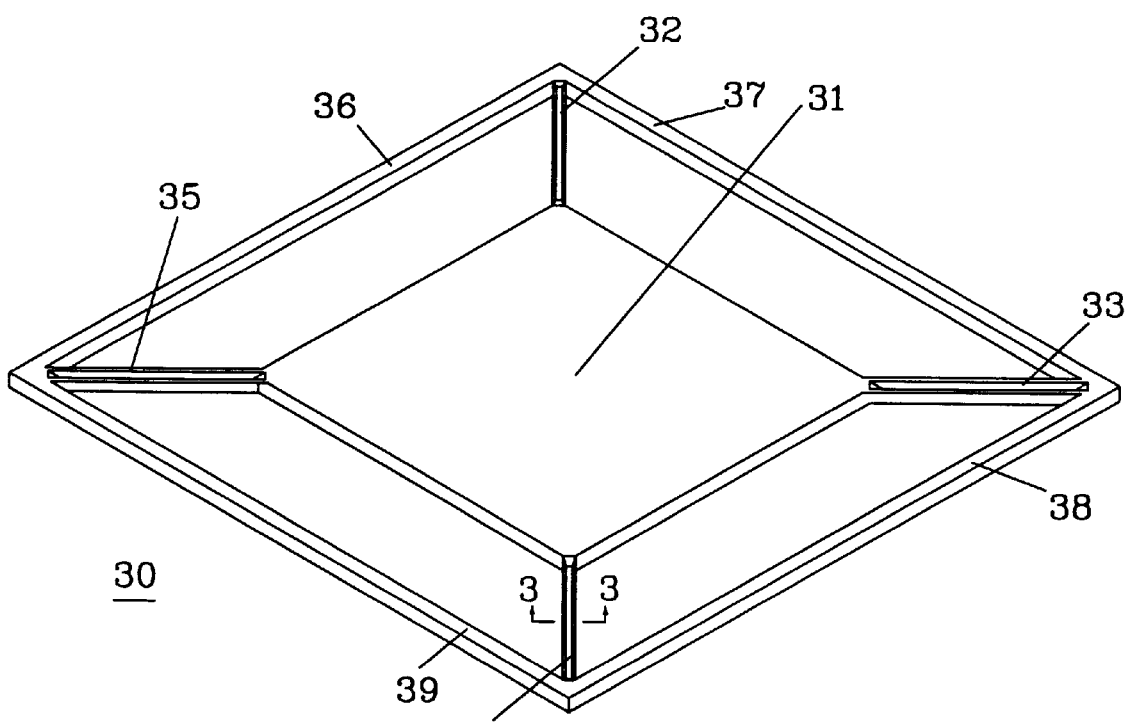
FIG. 3 shows a lead frame of the present invention with a channel beam tie bar.

FIG. 3. shows an embodiment of the invention in which a lead frame 30 has lead frame rails 36, 37, 38, and 39 which are attached to channel tie bars 32, 33, 34 and 35, which in turn support die mount pad 31. Channel tie bars 32–35 are not flat supports, but are in the form of a channel, for example, as shown in FIG. 4. Tie bar 34 in FIG. 4 has two side members 41 and 42 and a channel 44 over bottom member 43. Tie bars 32–35 each have at least two members extending at an angle from each other forming a channel along a portion of the length of the tie bar. In FIG. 4, each of members 41 and 42 extend upward at an angle from member 43. This channel structure provides a less flexible structure than the flat bar profile as shown in FIG. 2. The channel structure of tie bar 34 prevents tie bar 34, as well as tie bars 32, 33 and 35 (FIG. 3) from flexing or bending. This added strength of tie bars 32–35 prevents die pad 31 from flexing during molding of a semiconductor package around lead frame 30.

Lead frames are made from stamping the lead frame from a flat metal plate, or masking a metal plate, then chemically etching the masked plate to form the lead frame. In the embodiment of FIGS. 3 and 4, the lead frame 30 with channel tie bars can be made by either stamping or chemically etching. Also, the lead frame can be stamped, then the channels of tie bars 32–35 can formed by etching.

Figure 5:
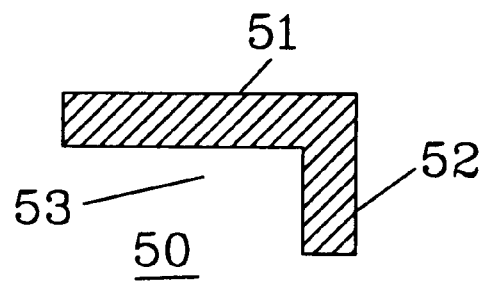
FIG. 5 is a cross-sectional view of another embodiment of the channel beam tie bar.

FIG. 5 shows another embodiment of a channel tie bar. In this embodiment, tie bar 50 has a horizontal part 51 and a vertical part 52 which has been bent downward to form an "L" shaped channel tie bar. Vertical part 52 extends at an angle of approximately 90 degrees from horizontal part 51. Channel bar 50 can also be formed by etching channel 53 from a solid tie bar.

Figure 6:
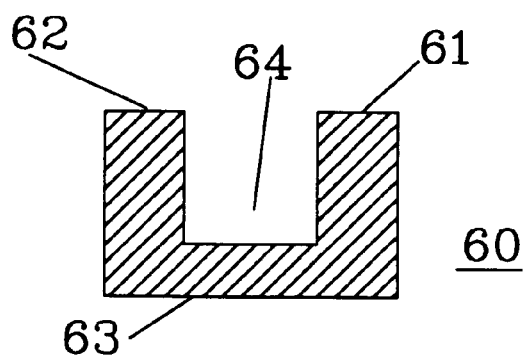
FIG. 6 is a cross-sectional view of another embodiment of the channel beam tie bar.

FIG. 6 shows another embodiment of a channel tie bar that is generally "U" shaped. In this embodiment channel tie bar 60 has a horizontal member 63 and two vertical members 61 and 62. In an alternate embodiment, one of the vertical members, 61, 62, may be bent in a direction 180 degrees from the other. Channel 64 is formed when members 61 and 62 are bent upward. Tie bar 60 may also be formed by chemically etching channel 64 from a solid tie bar.

FIG. 7 is a partial view of a lead frame 70 showing the side rails 71 and 72, channel tie bar 74 and die mount pad 73. Channel tar bar 74 has been formed with a portion 76 that has been bent downward from the top surface 75 of tie bar 74. To allow bending adjacent to rail 72, part 76 has a tapered section 77.

FIG. 8 is a top view of the partial lead frame 70 before part 76 is bent downward along dotted line 79. In this view, both ends of part 76 have been tapered at 77 and 78.

FIG. 7 and FIG. 8 show basically the structure of FIG. 5, but structures similar to FIG. 4 and FIG. 6 can also be made using the same procedure.

In the above embodiments, a rectangular die mount pad has been illustrated, but other geometries may be used for the die mount pad. For example, a circular die mount pad with channel tie bars spaced around the circular periphery may be used. Lead frames with channel tie bars may be made by either stamping or chemical etching. When a stamping method is used, the channel may be made either by deforming the die bar or bending one portion of the tie bar with respect to another portion of the tie bar. When chemical etching is used, a channel is etched into the surface of the tie bar.

What is claimed is:

1. A semiconductor lead frame with improved die pad stability, comprising:

a lead frame having a plurality of rails;

a plurality of lead frame leads attached to said lead frame rails;

a die mount pad; and at least two channel tie bars, each channel tie bar having at least two members extending at an angle from each other forming a channel along at least a portion of the length of the tie bar, extending at spaced intervals from the periphery of the die mount pad to said lead frame rails.

2. The lead frame according to claim 1, wherein said channel tie bars are attached, one each at an intersection of adjacent lead frame rails.

3. The lead frame according to claim 1, wherein each channel tie bar includes at least two members, one member extending from the other at an angle of less than 180°, and a channel adjacent to and along the two members.

4. The lead frame according to claim 1, wherein the channel in the tie bar is enclosed on at least two sides by parts of the tie bar.

5. A semiconductor lead frame with improved die pad stability, comprising:

a lead frame having a plurality of rails;

a plurality of lead frame leads attached to said lead frame rails;

a die mount pad; and a plurality of channel tie bars, each channel tie bar having at least two members extending at an angle from each other forming a channel along at least a portion of the length of the tie bar, extending at spaced intervals from the periphery of the die mount pad to said lead frame rails.

6. The lead frame according to claim 5, wherein said channel tie bars are attached, one each at an intersection of adjacent lead frame rails.

7. The lead frame according to claim 5, wherein the channel in the tie bar is enclosed on at least two sides by parts of the tie bar.

* * * * *